United States Patent
Tanaka et al.

(10) Patent No.: US 6,254,718 B1
(45) Date of Patent: Jul. 3, 2001

(54) COMBINED CMP AND PLASMA ETCHING WAFER FLATTENING SYSTEM

(75) Inventors: Chikai Tanaka; Michihiko Yanagisawa; Shinya Iida, all of Ayase; Yasuhiro Horiike, 2-12, Higashifushimi 3-chome, Houya-shi, Tokyo, all of (JP)

(73) Assignees: SpeedFam Co., Ltd.; Yasuhiro Horiike, both of Tokyo (JP)

( * ) Notice: Subject to any disclaimer, the term of this patent is extended or adjusted under 35 U.S.C. 154(b) by 0 days.

(21) Appl. No.: 09/260,336

(22) Filed: Mar. 1, 1999

(30) Foreign Application Priority Data

Apr. 21, 1998 (JP) .................................................. 10-126681

(51) Int. Cl.[7] .............................. H05H 1/00; C23C 16/00
(52) U.S. Cl. ........................................... 156/345; 118/504
(58) Field of Search ....................... 156/345; 118/723 E, 118/728, 715, 719, 504

(56) References Cited

U.S. PATENT DOCUMENTS

| 5,662,785 | * | 9/1997 | Schertler | ........................... | 204/298.25 |
| 5,683,537 | * | 11/1997 | Ishii | ....................................... | 156/345 |
| 5,814,240 | * | 9/1998 | Yamashita | ................................ | 216/88 |
| 5,980,685 | * | 11/1999 | Kimura | .................................. | 156/345 |

FOREIGN PATENT DOCUMENTS 9-27482    1/1997 (JP) .

* cited by examiner

Primary Examiner—Gregory Mills
Assistant Examiner—P. Hassanzadeh
(74) Attorney, Agent, or Firm—Burr & Brown

(57) ABSTRACT

A wafer flattening process designed to flatten the entire surface of the wafer to a higher precision by projecting the fall in the etching rate at the outer peripheral portion of the wafer and forming the outer peripheral portion of the wafer thinner in advance before plasma etching the entire surface of the wafer, a wafer flattening system, and a wafer flattened by the same. The wafer flattening system is provided with a CMP apparatus 1 and a plasma etching apparatus 2 are provided. The outer peripheral portion Wb of a wafer W held by a carrier 11 is polished thinner than an inside portion Wc of the wafer W by the CMP apparatus 1 having a platen 10 formed with a recessed surface. Specifically, it is polished so that the maximum thickness at the outer peripheral portion Wb of the wafer W becomes not more than the minimum thickness at the inside portion Wc. Suitably thereafter, the plasma etching apparatus 2 locally etches the surface Wa of the wafer W to obtain a wafer W with a high flatness without any projecting portion at the outer peripheral portion Wb.

3 Claims, 11 Drawing Sheets

COMBINED CMP AND PLASMA ETCHING WAFER FLATTENING SYSTEM

BACKGROUND OF THE INVENTION

1. Field of the Invention

The present invention relates to a wafer flattening process for flattening the surface of a wafer polished to a mirror surface in a previous process to a further high precision by a plasma etching apparatus, a wafer flattening system, and a wafer.

2. Description of the Related Art

FIG. 15 is a process diagram showing an example of a wafer flattening process of the related art.

In FIG. 15, reference numeral 100 is a chemical mechanical polishing (CMP) apparatus, while reference numeral 200 is a plasma etching apparatus.

In this wafer flattening process, first, in the CMP apparatus 100, a wafer W held and pressed by a carrier 101 is made to rotate in an opposite direction to a rotating platen 102 to chemically mechanically polish the surface Wa of the wafer W to a mirror surface by a polishing pad 102a of the platen 102. Suitably thereafter, the wafer W is conveyed to the plasma etching apparatus 200 where the surface Wa is turned upward and the wafer W held by a holder 201. Next, ion or radical or other activated species gas G produced in a plasma generator 202 is sprayed from a nozzle 203 to the surface Wa of the wafer W to locally etch a portion of the surface Wa thicker than the reference thickness value (hereinafter referred to as a "relatively thick portion").

Specifically, as shown in FIG. 16, the holder 201 is made to move to position where the nozzle 203 directly above a relatively thick portion of the wafer W and locally etch the relatively thick portion by the activated species gas G from the nozzle 203 to further flatten the surface Wa.

The wafer flattening process of the above related art, however, suffered from the following problems.

The activated species gas G sprayed from the nozzle 203 is a fluid and etches a substance by a chemical reaction with that substance. Accordingly, if the conditions of the region of spraying of the activated species gas G differ, the amount of etching of the substance also changes.

That is, as shown in FIG. 16, when the nozzle 203 is positioned at the inside portion of the wafer W, since the activated species gas G is sprayed under evacuated environment existing only wafer, the activated species gas G is sprayed almost symmetrically toward the center of the nozzle, thereby reacting silicon and the like of the surface Wa and etching relatively thick portion thereof at predetermined amount.

In contrast, shown in FIG. 17, when the nozzle 203 is positioned over the outer peripheral portion of the wafer W, the activated species gas G is sprayed across the outer peripheral portion of the wafer W and the holder 201 and activated species gas G causes a chemical reaction with the holder 201 formed by aluminum etc. As a result, the product A of the chemical reaction between the holder 201 and the activated species gas G deposits on the surface etc. of the outer peripheral portion and inhibits the etching of the outer peripheral portion and the amount of etching of the outer peripheral portion ends up drastically falling.

Further, as shown in FIG. 18, when there is a level difference between the surface Wa of the wafer W and the surface of the holder 201, the flow of the activated species gas G becomes disturbed at the level difference portion, more activated species gas G ends up flowing to the outside of the wafer W, and the amount of etching of the outer peripheral portion drastically falls.

In this way, in the wafer flattening process of the related art, due to the difference in the conditions between the inside portion and the outer peripheral portion of the wafer W, the outer peripheral portion of the wafer W remains as shown in FIG. 19 and the fall in the total thickness value (TTV) of the wafer W becomes a problem.

SUMMARY OF THE INVENTION

The present invention was made to solve the above problems and has as its object to provide a wafer flattening process designed to flatten the entire surface of the wafer to a higher precision by projecting the fall in the etching rate at the outer peripheral portion of the wafer and forming the outer peripheral portion of the wafer thinner in advance before plasma etching the entire surface of the wafer, a wafer flattening system, and a wafer flattened by the same.

To achieve the above object, according to an aspect of the present invention, there is provided a wafer flattening process comprising: an outer peripheral portion processing step for processing the outer peripheral portion of the wafer so that a maximum thickness at a predetermined width of the outer peripheral portion of the wafer surface becomes not more than a minimum thickness at a portion inside from the outer peripheral portion; and a plasma etching step for locally etching a relatively thick portion by spraying plasma activated species gas from a nozzle of a predetermined diameter of opening toward the corresponding relatively thick portion of the wafer surface after the outer peripheral portion processing step.

In this configuration, it is possible to process the outer peripheral portion of the wafer in the outer peripheral portion processing step, then etch the entire surface of the wafer in the plasma etching step. At this time, the etching rate of the outer peripheral portion becomes lower than the etching rate of the portion inside from the outer peripheral portion, but since the outer peripheral portion is processed so that its maximum thickness becomes not more than the minimum thickness of the portion inside from the outer peripheral portion, the situation where the fall in the etching rate causes the outer peripheral portion to remain thickly does not arise.

The outer peripheral portion processed in the outer peripheral portion processing step may be any width, but as an optimum example, the width of the outer peripheral portion is substantially the same as the diameter of the opening of the nozzle.

Further, the outer peripheral portion processing step need only process the outer peripheral portion of the wafer to a predetermined thickness. This may be achieved by various processing methods such as polishing and plasma etching.

Therefore, according to the aspect of the invention, the outer peripheral portion processing step is a polishing step which brings the surface of the wafer held by the carrier into contact with a polishing pad of a rotating platen and makes the pressing force on the outer peripheral portion of the wafer higher than the pressing force on the inside portion so as to polish the outer peripheral portion to a mirror surface. Further, as a prime example of the polishing, according to the aspect of the invention, the outer peripheral portion processing step is chemical mechanical polishing.

Further, as a prime example of application of plasma etching to this outer peripheral portion processing step, according to the aspect of the invention, the outer peripheral portion processing step comprises etching only the outer peripheral portion by spraying an activated species gas from above an etching protection plate toward the entire surface of the wafer.

In this configuration, only the outer peripheral portion not covered by the etching projection plate is etched by the activated species gas and is etched to a predetermined thickness.

Further, according to the aspect of the invention, the outer peripheral portion processing step etches the outer peripheral portion by arranging a hollow ring member of a shape corresponding to the outer peripheral portion of the wafer facing the outer peripheral portion, supplying the activated species gas into the hollow ring member, and spraying it from a plurality of holes formed at predetermined intervals in the hollow ring member.

In this configuration, the outer peripheral portion is etched by the activated species gas from a nozzle moving relative to the outer peripheral portion.

Further, the wafer flattening process of the above aspect of the invention may stand as an invention of a system by using specific apparatuses for executing the different steps.

Therefore, according to the aspect of the invention, there is provided a wafer flattening system comprising: an outer peripheral portion processing apparatus for processing the outer peripheral portion of a wafer by polishing or plasma etching so that a maximum thickness at a predetermined width of the outer peripheral portion of the wafer surface becomes not more than a minimum thickness at a portion inside from the outer peripheral portion; and a plasma etching apparatus having a holder carrying a wafer processed at the outer peripheral portion processing apparatus, a plasma generator generating a plasma, a nozzle having an opening of a diameter substantially the same as the width of the outer peripheral portion and spraying activated species gas generated at the plasma generator toward the wafer surface, and a moving mechanism for moving the nozzle relative to a predetermined position on the wafer surface.

Further, according to the aspect of the invention, the outer peripheral portion processing apparatus is a chemical mechanical polishing apparatus comprising: a platen having a surface as a whole with a polishing pad formed recessed deepest at the center portion of rotation; a carrier for bringing the surface of the held wafer into contact with the polishing pad of the platen, and a rotary drive mechanism for making the platen; and the carrier rotate in mutually opposite directions. Further, according to the aspect of the invention, the outer peripheral portion processing apparatus is a plasma etching apparatus comprising: a holder for carrying the wafer; a protection plate carrying mechanism for placing an etching protection plate on the wafer surface except for the outer peripheral portion of the wafer carried on the holder; a plasma generator for generating plasma; and a nozzle for spraying an activated species gas generated in the plasma generator from above the etching protection plate to the entire surface of the wafer. Further, according to the aspect of the invention, the outer peripheral portion processing apparatus is a plasma etching apparatus comprising: a holder for carrying the wafer; a hollow ring member shaped corresponding to the outer peripheral portion of the wafer, having a plurality of holes formed at predetermined intervals, and arranged facing the outer peripheral portion; and a plasma generator for generating plasma, and supplying the generated activated species gas to the inside of the hollow ring member.

Therefore, according to the aspect of the invention, there is provided a wafer with an outer peripheral portion processed so that the maximum thickness at a relatively thick portion remaining at a predetermined width of the outer peripheral portion of the surface becomes not more than a minimum thickness at a portion inside from the outer peripheral portion.

BRIEF DESCRIPTION OF THE DRAWINGS

The above and other objects, features, and advantages of the present invention will become more readily apparent from the following description of presently preferred embodiments of the invention taken in conjunction with the accompanying drawings, in which.

DESCRIPTION OF THE PREFERRED EMBODIMENTS

Below, embodiments of the present invention will be explained with reference to the drawings.

First Embodiment

Figure 1:
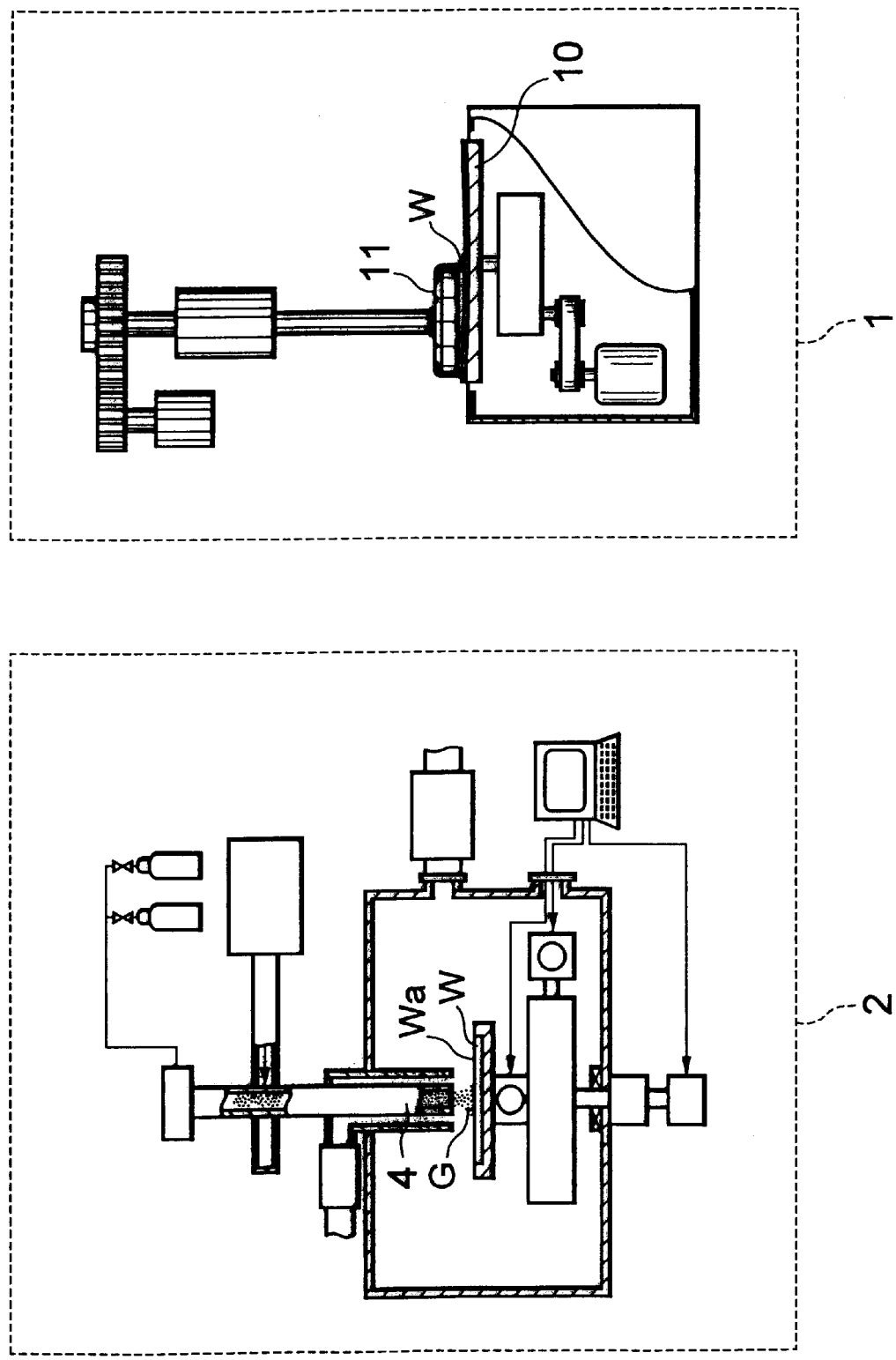
FIG. 1 is a view of the configuration of a wafer flattening system according to a first embodiment of the present invention.

FIG. 1 is a view of the configuration of a wafer flattening system according to a first embodiment of the present invention.

As shown in FIG. 1, the wafer flattening system is provided with a CMP apparatus 1 serving as the outer peripheral portion processing apparatus and a plasma etching apparatus 2.

The CMP apparatus 1 is an apparatus for polishing the outer peripheral portion of the surface of the wafer W to a predetermined thickness.

Figure 2:
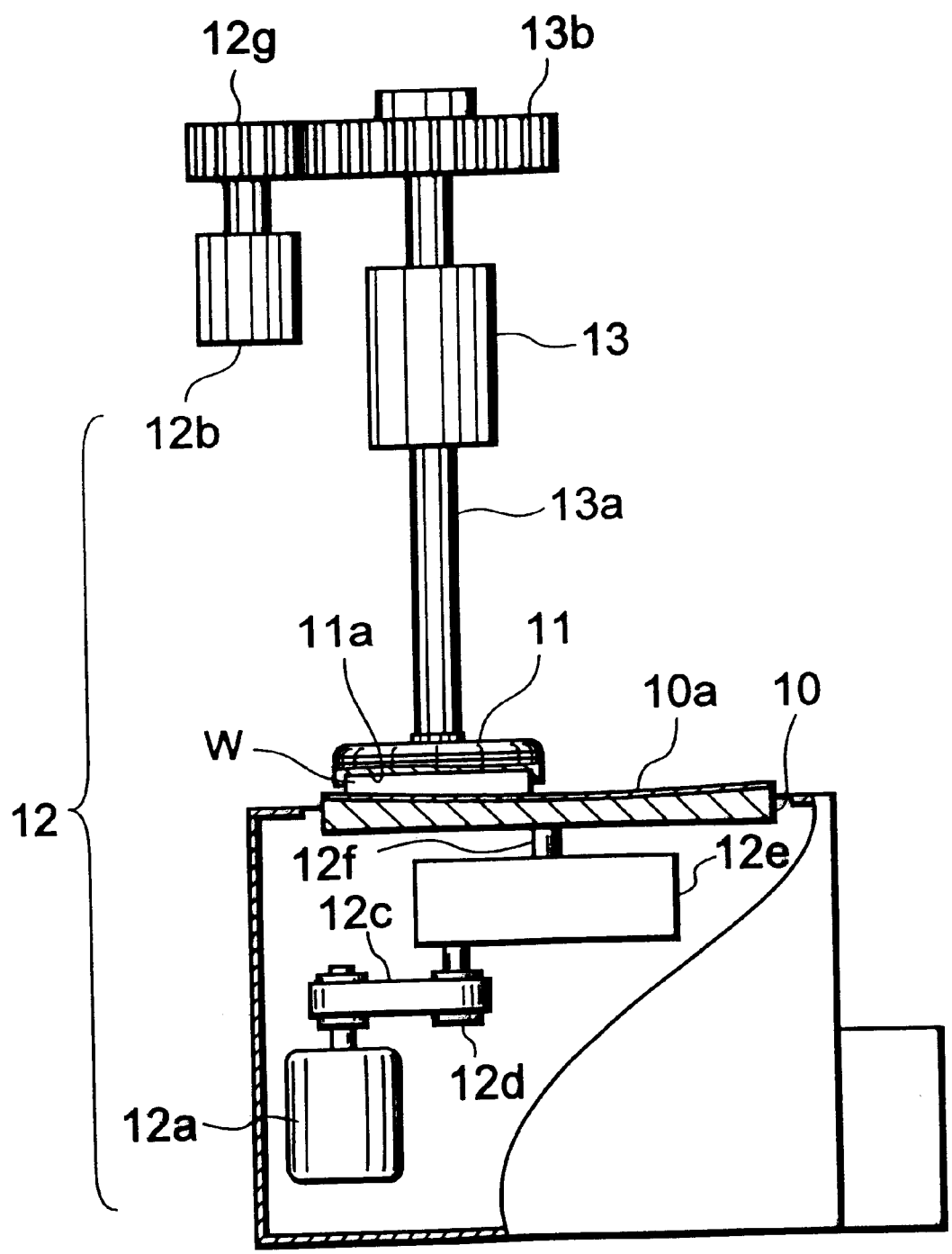
FIG. 2 is a front view showing the CMP apparatus of FIG. 2 enlarged.

FIG. 2 is a partially cutaway front view of the CMP apparatus.

As shown in FIG. 2, the CMP apparatus is an apparatus of substantially the same structure as a general CMP apparatus and is provided with a platen 10 having a polishing pad 10a attached to its surface, a carrier 11, and a rotary drive mechanism 12 for making the platen 10 and the carrier 11 rotate in mutually opposite directions by a main motor 12a and a motor 12b.

The platen 10 is driven to rotate by the main motor 12a of the rotary drive mechanism 12. That is, the rotation of the main motor 12a is transmitted to a pulley 12c, the rotation of the pulley 12d is converted in speed by a transmission 12e and transmitted to an output shaft 12f, and the platen 10 is rotated at a predetermined speed.

Further, the platen 10 has distinctive characteristics in its surface shape.

Figure 3:
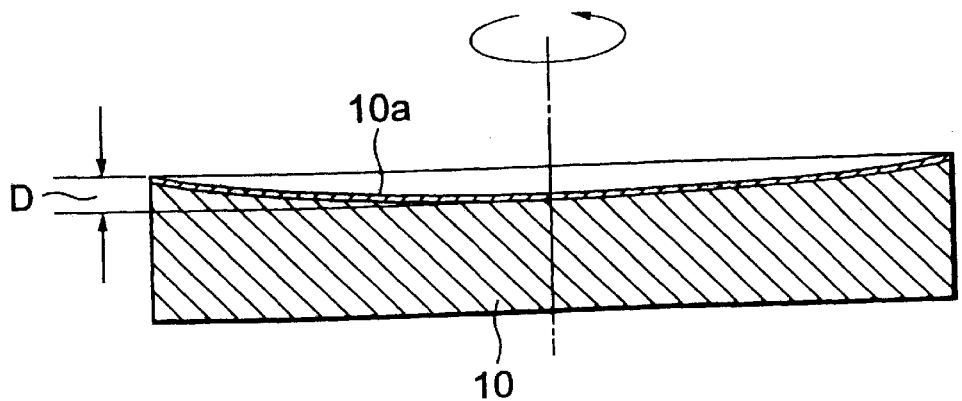
FIG. 3 is a sectional view of a platen.

FIG. 3 is a sectional view of the platen 10.

As shown in FIG. 3, the surface of the platen 10 is formed to be deepest at the center of rotation and to become shallower the further toward the outer edge and forms a recessed sectional shape as a whole.

Further, in FIG. 2, the carrier 11 is a device for pressing the wafer W by a predetermined pressure to the polishing pad 10a of the platen 10 and has a recessed portion 11a for holding the wafer W at its bottom surface.

The carrier 11 is attached to the lower end portion of a piston rod 13a of a cylinder 13 and rises or descends by driving the cylinder. Further, a gear 12g attached to the shaft of the motor 12b of the rotary drive mechanism 12 is engaged with a gear 13b of an upper end of the piston rod 13a passing through the cylinder 13.

Due to this, if the motor 12b is driven, the rotation of the shaft is transmitted through the gears 12g and 13b to the carrier 11 and the carrier 11 holding the wafer W rotates in an opposite direction to the platen 10.

On the other hand, the plasma etching apparatus 2 is a general apparatus for locally etching and flattening the wafer W processed by the CMP apparatus 1.

Figure 4:
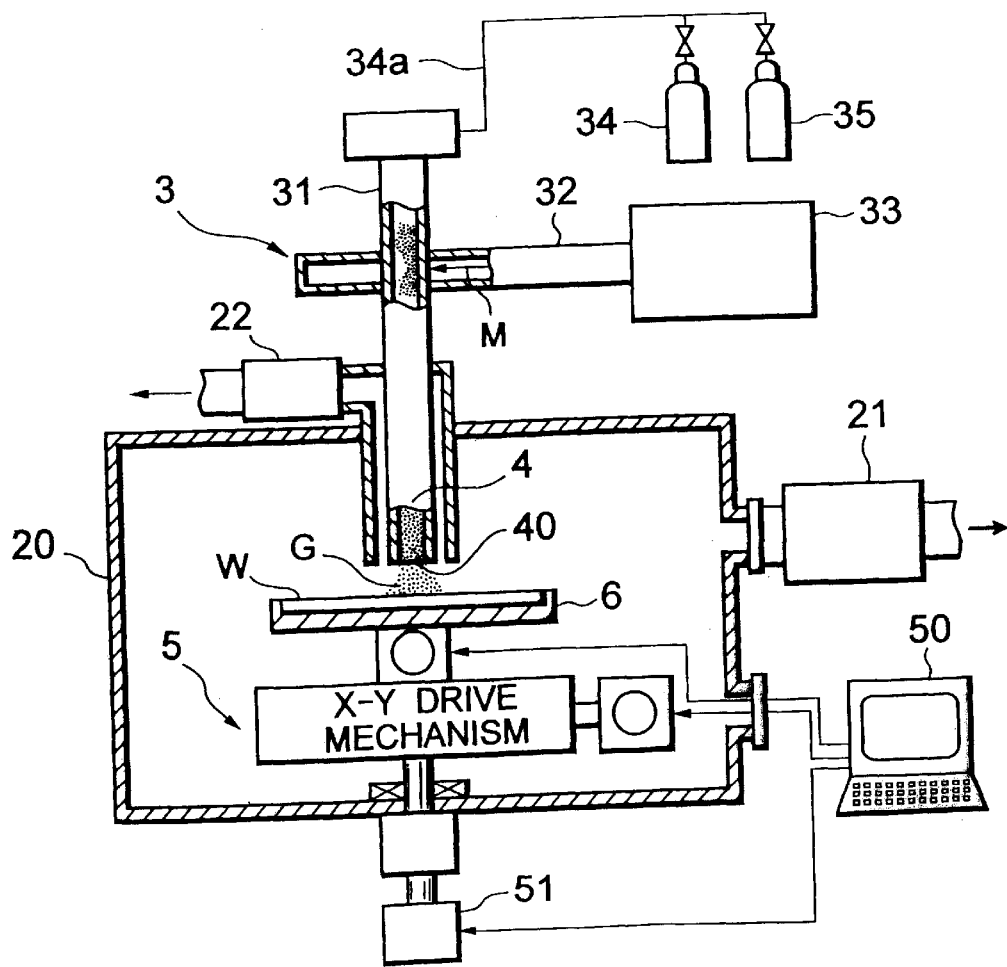
FIG. 4 is a schematic sectional view showing a plasma etching apparatus of FIG. 1 enlarged.

FIG. 4 is a schematic sectional view of the structure of the plasma etching apparatus.

As shown in FIG. 4, the plasma etching apparatus 2 is provided with a plasma generator 3, a nozzle 4, an X-Y drive mechanism 5 as a moving mechanism, and a holder 6.

The plasma generator 3 is a portion for generating an activated species gas G by plasma discharge and is comprised of a quartz discharge tube 31 affixed to an upper part of a chamber 20, a waveguide 32 attached to the outside of the quartz discharge tube 31, a microwave generator 33 for generating a predetermined microwave to the waveguide 32, and containers 34 and 35 connected through a supply tube 34a to the quartz discharge tube 31.

Due to this, if a reactive gas obtained by mixing the $CF_4$ gas, $O_2$ gas, etc. from the containers 34 and 35 is supplied to the quartz discharge tube 31 and a microwave M is generated from the microwave generator 33 to the inside of the waveguide 32, a plasma discharge occurs and $CF_3$ radical, F radical, or another activated species gas G is generated.

The nozzle 4 is formed at a lower end portion of the quartz discharge tube 31 positioned in the chamber 20. The activated species gas G generated by the plasma generator 3 is sprayed from the opening 40 to the wafer W side.

The X-Y drive mechanism 5 is a mechanism for moving the holder 6 in the X-Y directions (left-right and front-back directions in figure) and is controlled by a controller 50.

Further, the X-Y drive mechanism 5 has connected to it a Z-drive mechanism 51 for making the X-Y drive mechanism 5 as a whole ascend and descend in the Z-direction (up-down direction in the figure). The holder 6 moves up and down integrally with the X-Y drive mechanism 5 under the control of the controller 50.

The holder 6 is a member for holding the wafer W and as explained above is supported by the X-Y drive mechanism 5.

Figure 5:
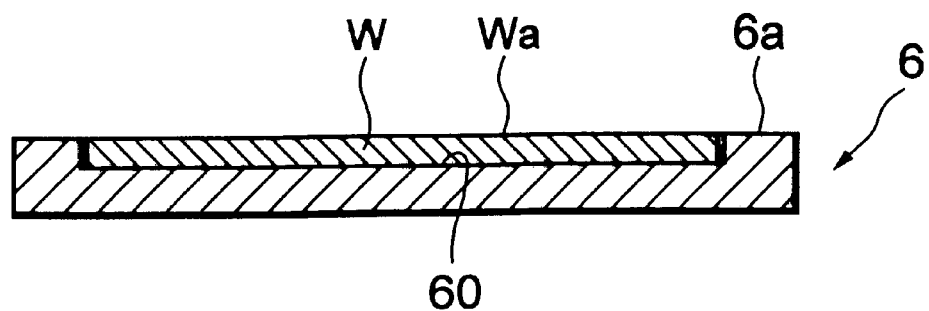
FIG. 5 is a sectional view of a holder.

FIG. 5 is a sectional view of the holder 6.

As shown in FIG. 5, the holder 6 is formed by aluminum etc. and has formed at its upper side a holding hole 60 for holding the wafer W. The depth of the holding hole 60 is set equal to the thickness of the wafer W. The surface Wa of the held wafer W and the upper surface 6a of the holder 6 become substantially the same plane.

Note that in FIG. 4, reference numerals 21 and 22 are vacuum pumps. The air inside the chamber 20 exhausts the products of the reaction between the activated species gas G and the wafer W to the outside of the chamber 20.

Next, an explanation will be given of the operation of the CMP apparatus according to this embodiment.

First, the outer peripheral portion processing step is executed at the CMP apparatus 1 shown in FIG. 1 and FIG. 2.

That is, the main motor 12a of the rotary drive mechanism 12 shown in FIG. 2 is driven to make the platen 10 rotate, the motor 12b is driven to make the carrier 11 rotate in the opposite direction from the platen 10 while pressing the carrier 11 holding the wafer W in the recessed portion 11a on the polishing pad 10a by the cylinder 13, and a predetermined slurry is supplied between the wafer W and the polishing pad 10a. This being so, the outer peripheral portion of the wafer W is polished more than the other portions.

Figure 6:
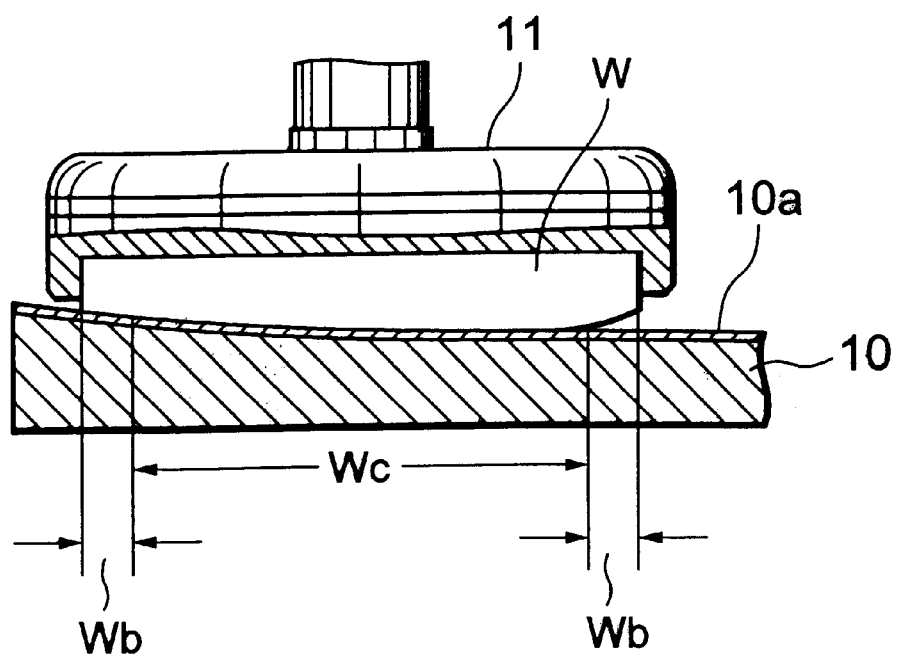
FIG. 6 is a sectional view showing more specifically the state of polishing of the outer peripheral portion of the wafer.

FIG. 6 is a sectional view showing the state of polishing of the outer peripheral portion of the wafer more specifically.

As shown in FIG. 6, if the wafer W is pressed by the carrier 11, since the outer edge side of the platen 10 is set shallower than the center side, a larger pressing force is applied to the portion of the wafer W positioned at the left of FIG. 6. Therefore, the polishing rate of the outer peripheral portion Wb of the rotating wafer W becomes higher than that of the inside portion Wc and the outer peripheral portion Wb of the wafer W is polished to become thinner than the inside portion Wc. At this time, the pressing force on the carrier 11 is adjusted so that the width of the outer peripheral portion Wb becomes substantially equal to the diameter of the opening 40 of the nozzle 4 at the plasma etching apparatus 2.

Figure 7:
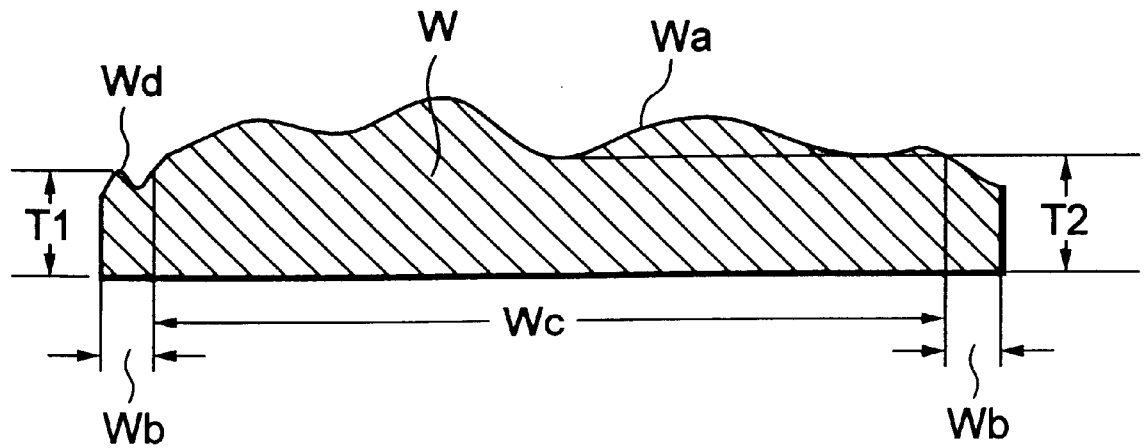
FIG. 7 is a sectional view of a wafer showing the relationship between the outer peripheral portion and the inside portion.

In this way, the wafer W is polished until the outer peripheral portion Wb of the wafer W becomes a predetermined thickness. Specifically, as shown in FIG. 7, it is polished so that the thickness T1 of the relatively thick portion Wd having the greatest thickness in the relatively thick portions existing at the outer peripheral portion Wb becomes not more than the thickness T2 of the portion of the inside portion Wc having the smallest thickness. For example, in the case of a wafer W of a diameter of 200 mm, about 1 μm is polished and the TTV of the wafer W as a whole is made about 1.53 μm.

The outer peripheral portion processing step is executed by the CMP apparatus 1 in this way to polish the outer peripheral portion Wb of the wafer W to a predetermined thickness, then the plasma etching step is executed by the plasma etching apparatus 2.

As shown in FIG. 4, when the wafer W finished being processed at the outer peripheral portion processing step is held in the holding hole 60 of the holder 5 and microwaves M are generated in the waveguide 32 from the microwave generator 33 and plasma discharge of the reactive gas in the quartz discharge tube 31 is caused, the activated species gas G is generated and the activated species gas G is sprayed from the opening 40 of the nozzle 4 to the wafer W.

Figure 8:
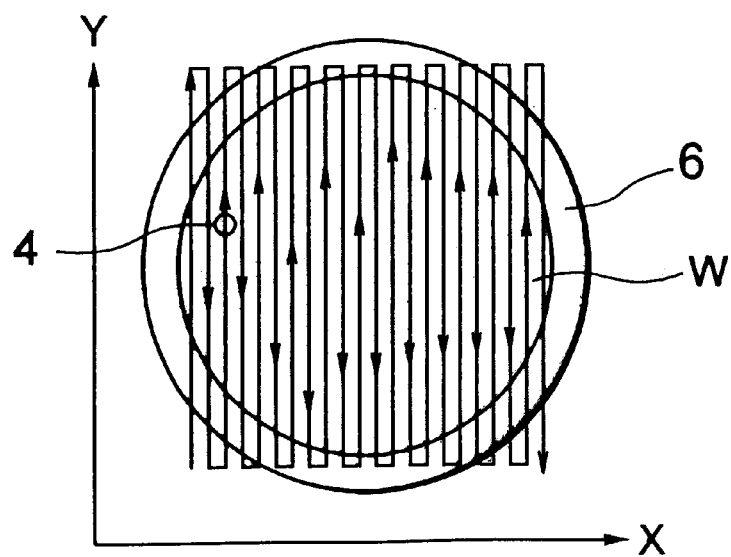
FIG. 8 is a plan view of the state of scanning of a nozzle.

In this state, the holder 6 is made to move in a zig-zag in the X-Y direction by the X-Y drive mechanism 5. Then, as shown in FIG. 8, the nozzle 4 scans the overall surface Wa of the wafer W relatively in a zig-zag pattern.

At this time, when the nozzle 4 arrives above the relatively thick portion of the wafer W, the relative speed is made slower to match the thickness value of the relatively thick portion under the control of the controller 50 and the relatively thick portion is locally etched flat.

Figure 9:
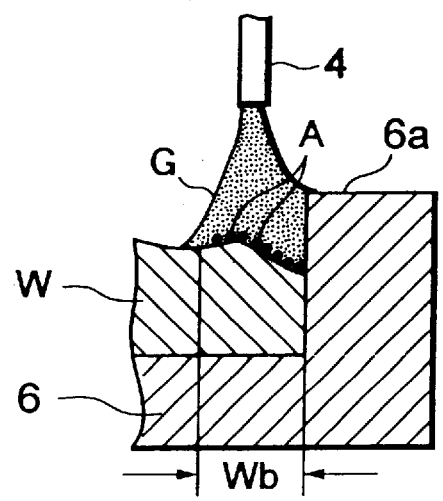
FIG. 9 is a sectional view of the state of etching of the outer peripheral portion.

This etching operation is performed over the wafer W as a whole, but as shown in FIG. 9, when the nozzle 4 arrives directly above the outer peripheral portion Wb, the reaction product A generated by the chemical reaction between the activated species gas G and the upper surface 6a of the holder 6 deposits covering the surface of the outer peripheral portion Wb and inhibits the etching of the outer peripheral portion Wb.

In this state, however, since the outer peripheral portion Wb has been polished in advance by the CMP apparatus 1 so that the maximum thickness of the outer peripheral portion Wb becomes not more than the minimum thickness of the inside portion Wc, the outer peripheral portion Wb will not be left thicker than the inside portion Wc due to the decline of the etching rate there.

That is, it is believed that, since the relatively thick portion present at the inside portion Wc of the wafer W is etched to substantially the same thickness as the portion having the minimum thickness of the inside portion Wc, the thickness of the inside portion Wc and the thickness of the outer peripheral portion Wb as a whole becomes substantially equal and the TTV of the wafer W is improved.

The present inventors were actually able to obtain a high quality wafer W of a TTV of 0.39 μm by polishing the outer peripheral portion Wb of a wafer W of 200 mm by the CMP apparatus 1 and then etching the wafer W given a TTV of 1.53 μm by the plasma etching apparatus 2 as explained above.

Second Embodiment

Figure 10:
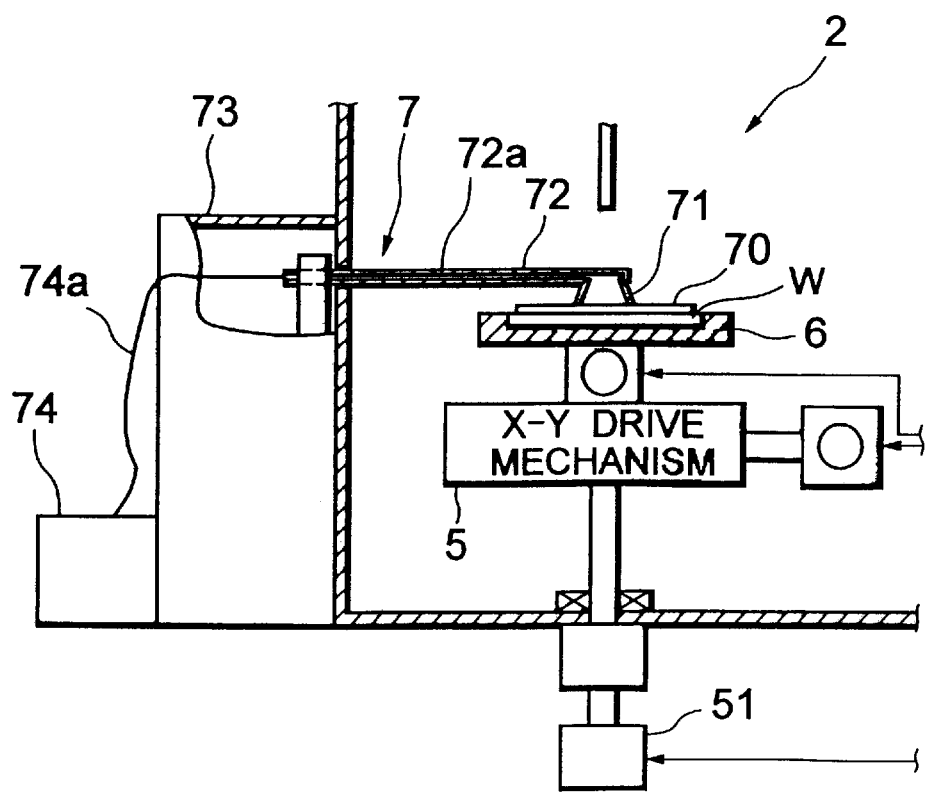
FIG. 10 is a sectional view of the essential portions of a plasma etching apparatus constituting a wafer flattening system according to a second embodiment of the present invention.

FIG. 10 is a schematic sectional view of the essential portions of a plasma etching apparatus constituting a wafer flattening system according to a second embodiment of the present invention.

This embodiment differs from the first embodiment explained above in the point of configuring the outer peripheral portion processing apparatus using the plasma etching apparatus 2 and not using the CMP apparatus 1.

As shown in FIG. 10, the plasma etching apparatus 2 is provided with the protection plate carrying mechanism 7.

The protection plate carrying apparatus 7 is a mechanism for placing the etching protection plate 70 on the inside portion Wc of the wafer W held in the holder 6 and is provided with an arm 72 having a suction pad 71 at the lower side of its front end, a pad mover 73, and an air pump 74.

The etching protection plate 70 is a dish member having a diameter set to substantially the same as the diameter of the inside portion Wc of the wafer W.

The arm 72 has a hollow portion 72a communicated with the inside portion of the suction pad 71. The pad mover 73 is structured to extend its arm 72 out to the holder 6 side or retract the arm 72 to the pad mover 73 side. Further, the air pump 74 is a device for sucking out the air in the suction pad 71 or sending air into the suction pad 71. A tube 74a is connected to the hollow portion 72a of the arm 72.

Next, an explanation will be given of the outer peripheral portion processing step executed by the plasma etching apparatus 2 of this embodiment.

Figure 11A:
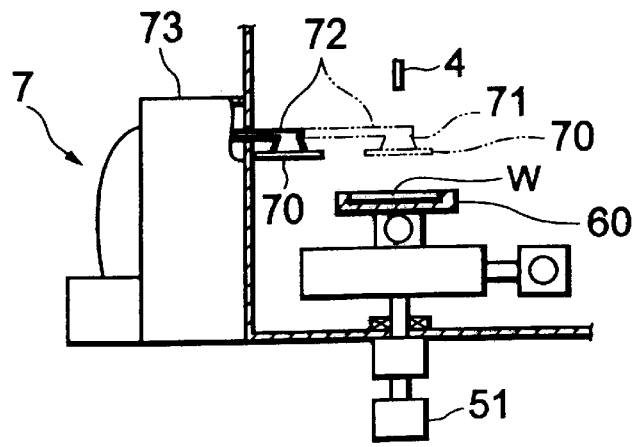
FIG. 11-A to 11-C is a process diagram of an outer peripheral portion processing step in the second embodiment.
Figure 11B:
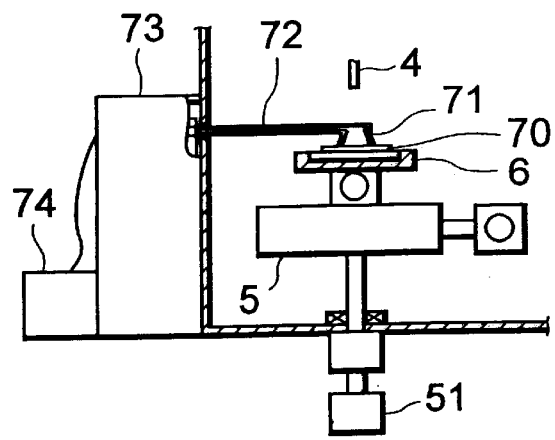
Figure 11C:
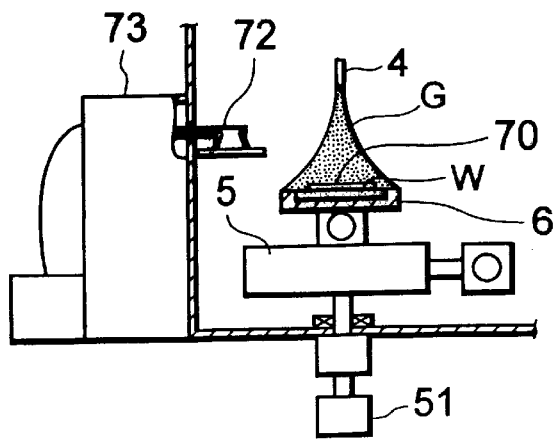

FIGS. 11A to 11C are process diagrams of the outer peripheral portion processing step.

First, as shown in FIG. 11A, the Z-drive mechanism 51 makes the holder 6 holding the wafer W descend together with the X-Y drive mechanism 5, while the pad mover 73 of the protection plate carrying mechanism 7 makes the arm 72 holding the etching protection plate 70 by suction extend out to directly above the wafer W as shown by the two-dot dash line.

Further, as shown by FIG. 11B, the Z-drive mechanism 51 makes the holder 6 ascend together with the X-Y drive mechanism 5, stops the rise of the holder 6 at the point where the etching protection plate 70 contacts the inside portion Wc of the wafer W, and releases the suction force of the suction pad 71 on the etching protection plate 70 by the air pump 74.

This being done, the etching protection plate 70 is placed on the inside portion Wc and only the outer peripheral portion Wb is exposed.

Suitably thereafter, as shown by FIG. 11C, the arm 72 is pulled in to the pad mover 73 side and the holder 6 is made to descent together with the X-Y drive mechanism 5.

Next, in this state, when the activated species gas G is sprayed from the nozzle 4 toward the wafer W, the activated species gas G spreads downward largely and the wafer W as a whole is sprayed by the activated species gas G.

At this time, since the inside portion Wc of the wafer W is covered by the etching protection plate 70, only the outer peripheral portion Wb is etched by the activated species gas G. The activated species gas G is sprayed on the wafer W until the outer peripheral portion Wb becomes the above predetermined thickness, then the holder 6 is made to ascend and the arm 72 is extended to pick up the etching protection plate 70 by suction by the suction pad 71. The outer peripheral portion processing step is completed by pulling in the arm 72 holding the etching protection plate 70 by suction to the pad mover 73 side.

After this, when executing the plasma etching step, the surface Wa of the wafer W is etched in the same way as the above first embodiment in that state.

In this way, according to the wafer flattening system of this embodiment, since it is possible to achieve the outer peripheral portion processing step by using the plasma etching apparatus 2, a special outer peripheral portion processing apparatus like the CMP apparatus 1 is not required and therefore it is possible to reduce the cost of the facilities by that amount.

The rest of the configuration and the mode of operation and advantageous effects are similar to those of the first embodiment explained above, so explanations thereof will be omitted.

Third Embodiment

Figure 12:
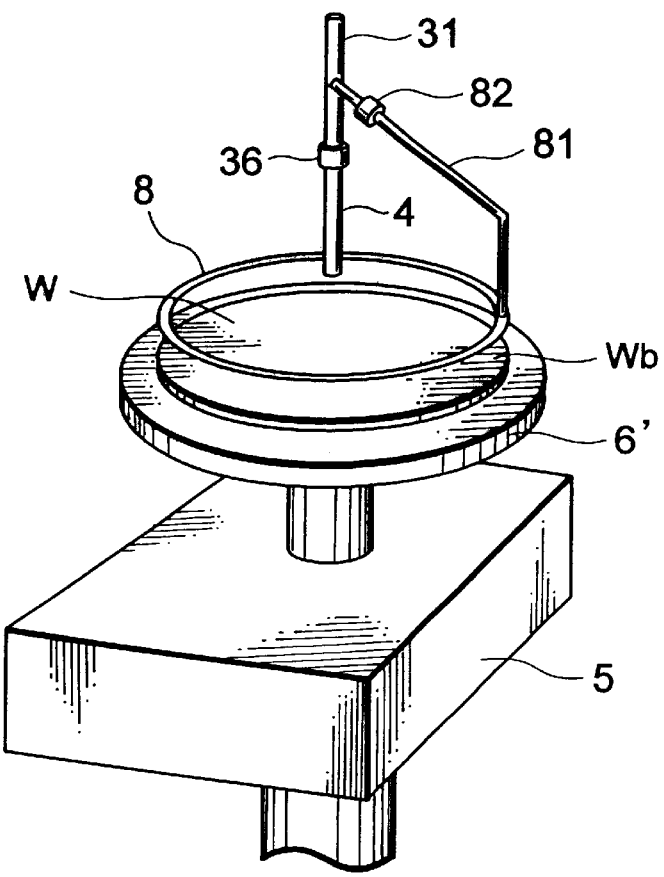
FIG. 12 is a perspective view of key portions of a plasma etching apparatus constituting a wafer flattening system according to a third embodiment of the present invention.

FIG. 12 is a schematic sectional view of the structure of a plasma etching apparatus constituting the wafer flattening system according to a third embodiment of the present invention.

This embodiment is similar to the above second embodiment in the point that the outer peripheral portion processing apparatus is configured using the plasma etching apparatus 2, but differs from the second embodiment in the point that the structure of the outer peripheral portion processing apparatus is simplified.

In FIG. 12, reference numeral 8 is a hollow ring member 8 and is connected to the lower end of a conduct 81 branched from the quartz discharge tube 31.

Figure 13:
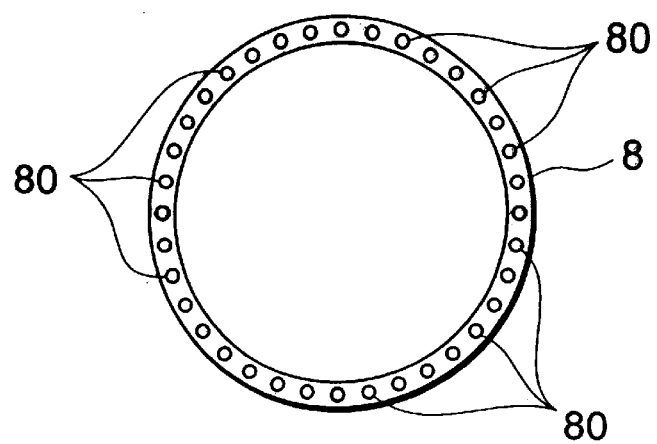
FIG. 13 is a plan view of the bottom surface of a hollow ring member.

FIG. 13 is a plan view showing the hollow ring member 8 from the bottom.

As shown in FIG. 13, the hollow ring member 8 forms a disk as a whole and has an outer diameter and thickness set to be substantially equal in outer shape to the outer diameter of the wafer W and the width of the outer peripheral portion Wb. A plurality of holes 80 are made at predetermined intervals in the bottom surface of the hollow ring member 8.

This hollow ring member 8, as shown in FIG. 12, is arranged to face the outer peripheral portion Wb of the wafer W and is supported by the conduit 81.

The conduit 81 communicates with the inside of the hollow ring member 8 through a lower opening. A valve 82 is interposed at its horizontal portion.

On the other hand, a valve 36 similar to the valve 82 is interposed in the quartz discharge tube 31. By operating these valves 36 and 82, it becomes possible to spray the activated species gas G from either of the nozzle 4 or holes 80 of the hollow ring member 8.

Further, the holder used in this embodiment is a disk-shaped holder 6'. The wafer W is placed on and affixed to the holder 6'.

Next, an explanation will be given of the outer peripheral portion processing step executed by the plasma etching apparatus 2 of this embodiment.

First, the valve 82 is opened in the state with the valve 36 closed and the activated species gas G generated in the plasma generator 3 (see FIG. 4) is supplied into the conduit 81.

This being done, the activated species gas G in the conduit 81 reaches the inside of the hollow ring member 8 and is sprayed from the plurality of holes 80 at the bottom surface toward the outer peripheral portion Wb of the wafer W.

At this time, since the upper surface of the holder 61 is below the outer peripheral portion Wb, the situation where the reaction product of the activated species gas G and the holder 6' deposits on the outer peripheral portion Wb and inhibits the etching of the outer peripheral portion Wb does not occur. Accordingly, while the etching rate is low, by taking time to etch the outer peripheral portion Wb, the outer peripheral portion Wb can be etched to the above predetermined thickness.

When executing the plasma etching step, the valve 82 is closed, then the valve 36 is opened and the activated species gas G is sprayed from the nozzle 4. Further, in the same way as the first embodiment explained above, the surface Wa of the wafer W is etched by the activated species gas G of the nozzle 4 while moving the holder 6 by the X-Y drive mechanism 5.

In this way, according to the wafer flattening system of this embodiment, not only there is no need for a special outer peripheral portion processing apparatus such as the CMP apparatus 1, the structure of the outer peripheral portion processing apparatus itself is simple, so it is possible to further slash the cost of the facilities.

The rest of the configuration and the mode of operation and advantageous effects are similar to those of the second embodiment explained above, so explanations thereof will be omitted.

Note that the present invention is not limited to the above embodiments and includes various modifications and changes within the gist of the invention.

For example, in the above embodiments, in the plasma etching apparatus 2, the nozzle 4 was fixed in place and the wafer W was made to move by the X-Y drive mechanism 5 to move the nozzle to a predetermined location of the surface Wa of the wafer W, but it is also possible to fix the wafer W in place and make the nozzle 4 to move.

Further, in the above embodiments, the explanation was given of a plasma generator 3 generating an activated species gas G using microwaves, but the plasma generator 3 need only be able to produce activated species gas G and is not limited to this.

Figure 14:
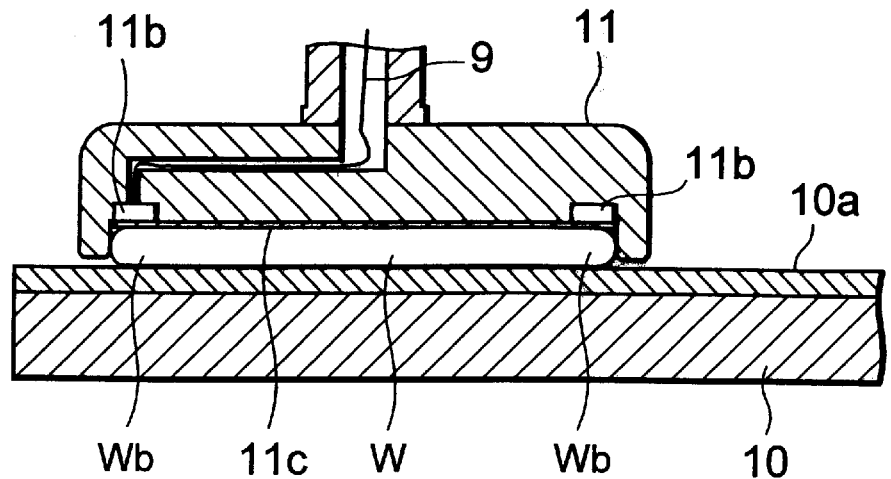
FIG. 14 is a sectional view of the platen 10 and the carrier 11.
Figure 15:
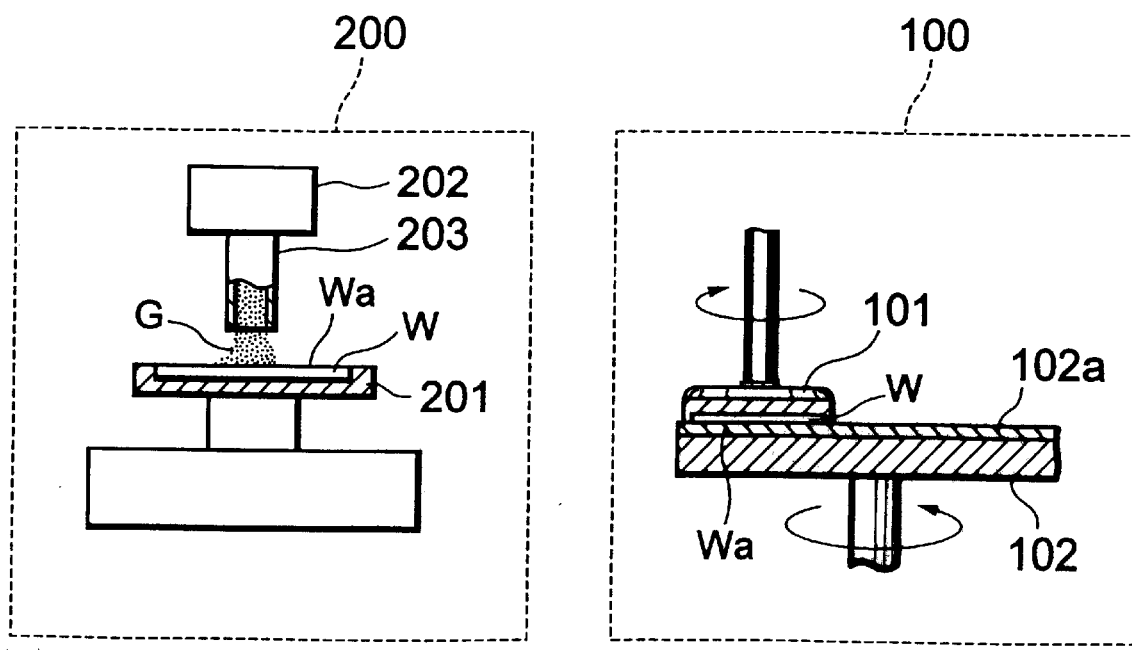
FIG. 15 is a process diagram of an example of a wafer flattening process of the related art.
Figure 16:
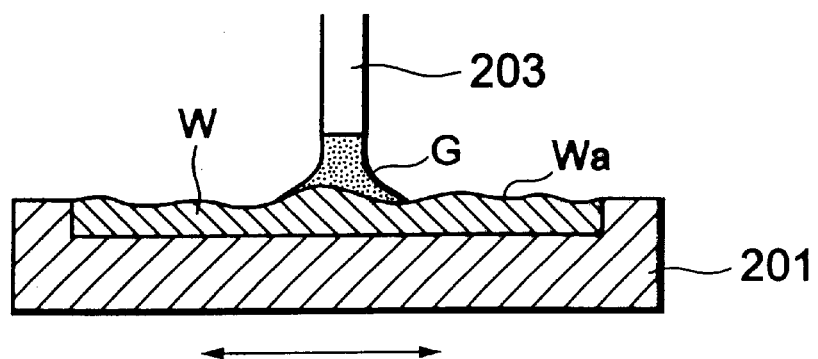
FIG. 16 is a sectional view of the state of movement of a nozzle in the plasma etching apparatus shown in FIG. 15.
Figure 17:
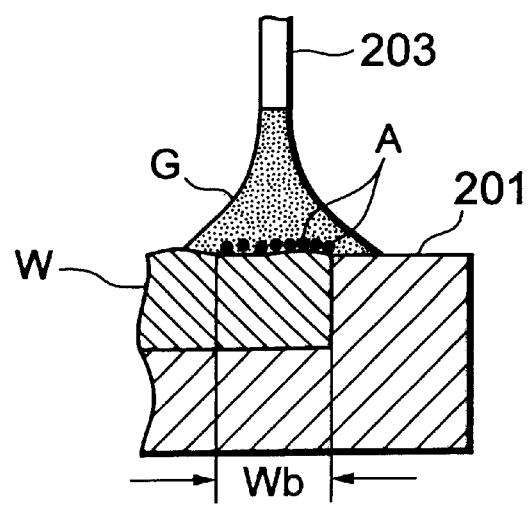
FIG. 17 is a sectional view for explaining the phenomenon of the fall in the etching rate at the outer peripheral portion of the wafer.
Figure 18:
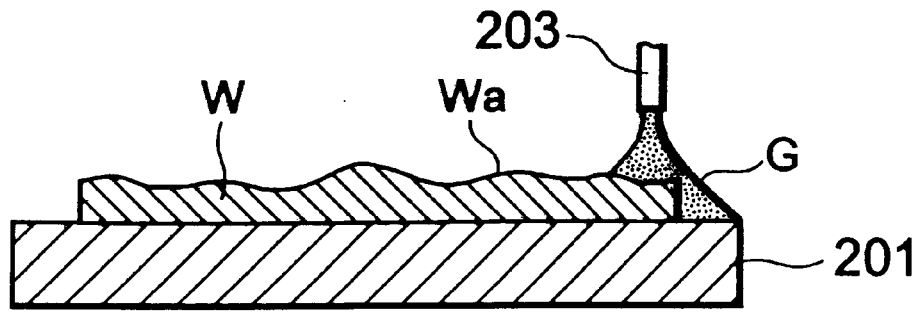
FIG. 18 is a sectional view for explaining the phenomenon of the fall of the etching rate when there is a level difference between the surface of the wafer and the surface of the holder.
Figure 19:
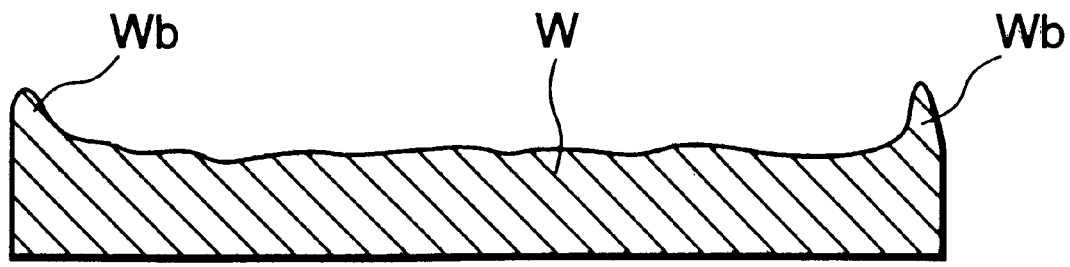
FIG. 19 is a sectional view of the wafer where the outer peripheral portion remains thick.

Further, in the above first embodiment, the surface of the platen 10 of the CMP apparatus 1 was formed recessed to execute the outer peripheral portion processing step, but it is also possible to use the carrier 11 shown in FIG. 14 and execute the outer peripheral portion processing step by a flat surface platen 10.

That is, as shown in FIG. 14, a ring-shaped pressure chamber 11b opening to the recessed portion 11a side is cut into a location at the bottom surface of the carrier 11 corresponding to the outer peripheral portion Wb of the wafer W and a film 11c is adhered over the entire lower surface of the carrier 11. Further, air of a predetermined pressure may be supplied into the pressure chamber 11b through the air hose 9 of a not shown air pump to make the pressing force on the outer peripheral portion Wb larger than the pressing force on the inside portion Wc and as a result polish the outer peripheral portion Wb to the above predetermined thickness.

Further, in the above second and third embodiments, the explanation was made of configurations for etching the outer peripheral portion Wb of the wafer W using an etching protection plate 70 or hollow ring member 8, but it is also possible to make the holder 6 rotate by the X-Y drive mechanism 5 of the plasma etching apparatus 2 to make the nozzle 4 spraying the activated species gas G move relatively along the outer peripheral portion Wb of the wafer W and thereby etching only the outer peripheral portion Wb.

Summarizing the advantageous effects of the invention, as explained above in detail, according to the aspects of the invention, since the outer peripheral portion of the wafer is not left thicker when etching by the activated species gas, there are the superior advantageous effects that it is possible to improve the flatness of the wafer surface as a whole and as a result obtain a wafer with an extremely excellent TTV compared with the wafer flattening process of the related art.

Further, according to the aspect of the invention, since only the portion inviting a reduction in the etching rate is processed in the outer peripheral portion processing step, it is possible to shorten the processing time of the outer peripheral portion.

Further, according to the aspects of the invention, since it is possible to execute the outer peripheral portion processing step using the facilities of the polishing step generally used in the prior step of the plasma etching, it is possible to obtain a wafer with a high flatness without inviting an increase in the cost of the facilities.

Further, according to the aspects of the invention, since it is possible to execute the outer peripheral portion processing step using the facilities used in the plasma etching step, it is possible to obtain a wafer with a high flatness without inviting an increase in the cost of the facilities.

What is claimed is:

1. A wafer flattening system comprising:

an outer peripheral portion processing apparatus comprising a platen having a polishing pad, said polishing pad formed so as to be most deeply recessed at a center portion of rotation of said platen, a carrier enabling said wafer to contact the polishing pad of said platen, and a rotary drive mechanism for rotating said platen and said carrier in opposite directions; and a plasma etching apparatus comprising a holder for carrying the wafer processed by said outer peripheral portion processing apparatus, a plasma generator for generating a plasma, a nozzle having an opening, said opening having a diameter of substantially the same width as the outer peripheral portion of said wafer, said nozzle capable of spraying activated species gas generated by the plasma generator toward the wafer surface, and a moving mechanism for moving the nozzle relative to the wafer surface;

wherein said outer peripheral portion processing apparatus is configured to process the wafer such that a maximum thickness at a predetermined width of the outer peripheral portion of the wafer surface becomes not more than a minimum thickness at a portion inside from the outer peripheral portion.

2. A wafer flattening system comprising:

an outer peripheral portion processing apparatus comprising a holder for carrying the wafer, a disk shaped protection plate carrying mechanism for placing an etching protection plate on the central portion of the wafer surface, a plasma generator for generating plasma, and a nozzle for spraying an activated species gas generated in the plasma generator from above the etching protection plate to an entire surface of the wafer; and a plasma etching apparatus, wherein said plasma etching apparatus has a holder, said holder carrying the wafer processed by said outer peripheral portion processing apparatus, a plasma generator for generating a plasma, a nozzle having an opening, said opening having a diameter of substantially the same width as the outer peripheral portion of said wafer, said nozzle capable of spraying activated species gas generated by the plasma generator toward the wafer surface, and a moving mechanism for moving the nozzle relative to the wafer surface;

wherein said outer peripheral portion processing apparatus is configured to process the wafer such that a maximum thickness at a predetermined width of the outer peripheral portion of the wafer surface becomes not more than a minimum thickness at a portion inside from the outer peripheral portion.

3. A wafer flattening system comprising:

an outer peripheral portion processing apparatus comprising a holder for carrying the wafer, a hollow ring member, said hollow ring member shaped to correspond to the outer peripheral portion of the wafer, said hollow ring member having a plurality of holes formed therein, said holes being formed at predetermined intervals and arranged to face the outer peripheral portion of said wafer, and a plasma generator for generating plasma and supplying said plasma to an inside of said hollow ring member shaped to correspond to the outer peripheral portion of the wafer; and a plasma etching apparatus, wherein said plasma etching apparatus has a holder, said holder carrying the wafer processed by said outer peripheral portion processing apparatus, a plasma generator for generating a plasma, a nozzle having an opening, said opening having a diameter of substantially the same width as the outer peripheral portion of said wafer, said nozzle capable of spraying activated species gas generated by the plasma generator toward the wafer surface, and a moving mechanism for moving the nozzle relative to the wafer surface;

wherein said outer peripheral polishing apparatus is configured to process the wafer such that a maximum thickness at a predetermined width of the outer peripheral portion of the wafer surface becomes not more than a minimum thickness at a portion inside from the outer peripheral portion.

* * * * *